US008605491B2

(12) United States Patent
Liaw (10) Patent No.: US 8,605,491 B2
(45) Date of Patent: Dec. 10, 2013

(54) MULTIPLE-PORT SRAM DEVICE (75) Inventor: Jhon Jhy Liaw, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 190 days.

(21) Appl. No.: 12/816,961

(22) Filed: Jun. 16, 2010

(65) Prior Publication Data

US 2010/0254210 A1  Oct. 7, 2010

Related U.S. Application Data (60) Division of application No. 12/398,423, filed on Mar. 5, 2009, now abandoned, which is a continuation of application No. 11/605,757, filed on Nov. 29, 2006, now Pat. No. 7,525,868.

(51) Int. Cl.
G11C 11/41 (2006.01)
G11C 11/412 (2006.01)
G11C 5/06 (2006.01)
G11C 7/02 (2006.01)
G11C 7/18 (2006.01)
G11C 8/14 (2006.01)
G11C 8/16 (2006.01)

(52) U.S. Cl.
USPC ........ 365/154; 365/156; 365/230.05; 365/63; 365/72; 365/206

(58) Field of Classification Search
USPC ........... 365/154, 156, 206, 230.05, 51, 63, 72
See application file for complete search history.

(56) References Cited

U.S. PATENT DOCUMENTS

| 6,262,932 | B1 | 7/2001 | Nguyen |
| 6,347,062 | B2 | 2/2002 | Nii et al. |
| 6,590,802 | B2* | 7/2003 | Nii ............................. 365/156 |
| 6,677,649 | B2 | 1/2004 | Osada et al. |
| 7,525,868 | B2 | 4/2009 | Liaw |
| 2001/0043487 | A1* | 11/2001 | Nii et al. .................... 365/154 |
| 2002/0117722 | A1* | 8/2002 | Osada et al. ................ 257/379 |

OTHER PUBLICATIONS

Koji Nii, "A 90NM Dual-Port SRAM with 2.04um 8T-Thin Cell Using Dynamically-Controlled Column Bias Scheme", 2004 IEEE International Solid State Circuits Conference.

* cited by examiner

Primary Examiner — J. H. Hur
(74) Attorney, Agent, or Firm — K&L Gates LLP (57) ABSTRACT A static random access memory (SRAM) cell having a dedicated read port separated from a write port comprises a first and a second bit-line placed in parallel forming a complimentary bit-line pair for the dedicated read port, a first and second metal line adjacently flanking in both side of and in parallel to the first bit-line, the first and second metal line being formed in the same metal layer as the first bit-line and having a first and second predetermined distance to the first bit-line, respectively, and a third and fourth metal line adjacently flanking in both side of and in parallel to the second bit-line, the third and fourth metal line being formed in the same metal layer as the second bit-line and having a third and fourth predetermined distance to the second bit-line, respectively, wherein the first predetermined distance is equal to the third distance and the second predetermined distance is equal to the fourth distance for keeping the first and second bit-lines having balanced capacitance loading.

9 Claims, 9 Drawing Sheets

MULTIPLE-PORT SRAM DEVICE

CROSS REFERENCE

This application is a Divisional Application of U.S. Ser. No. 12/398,423, filed on Mar. 5, 2009, entitled: MULTIPLE-PORT SRAM DEVICE, which is a Continuation Application of U.S. Ser. No. 11/605,757, filed on Nov. 29, 2006, now is U.S. Pat. No. 7,525,868.

BACKGROUND

The present invention relates generally to an integrated circuit (IC) design, and more particularly to a multiple-port static-random-access-memory (SRAM) cell structure with balanced read and write operation speeds and an improved noise margin.

SRAM devices have become increasingly popular as data storage units for high-speed communication devices, image processing devices, and other system-on-chip (SOC) products. A SRAM device is typically comprised of a logic circuit portion and a memory cell portion, which includes a plurality of cells arranged in one or more arrays. The SRAM cells, based on their structures, can be categorized as single-port cells, two-port cells, dual-port cells, and multiple-port cells. SRAM devices made of two-port, dual-port or multiple-port cells have become increasingly popular, as they are particularly suitable for parallel operations.

Figure 1A:
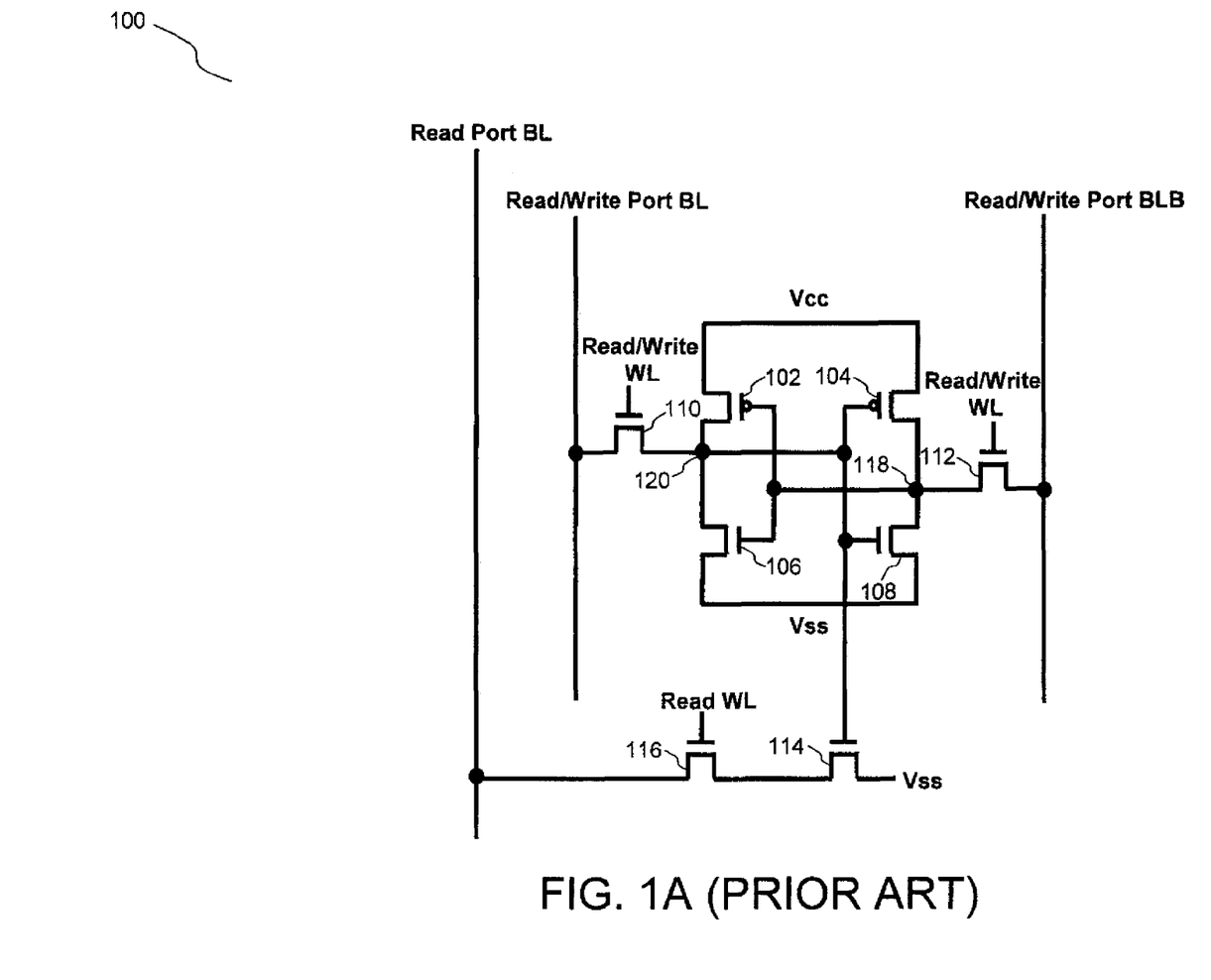
FIG. 1A schematically illustrates a conventional two-port SRAM cell implemented with eight transistors.

FIG. 1A schematically illustrates a conventional two-port SRAM cell 100 that is implemented with eight transistors. The conventional two-port SRAM cell 100 includes two PMOS transistors 102 and 104 and six NMOS transistors 106, 108, 110, 112, 114, and 116. The PMOS transistors 102 and 104 function as pull-up devices, while the NMOS transistors 106 and 108 function as pull-down devices. The NMOS transistors 110 and 112 function as pass-gate devices for read or write operations. The sources of the PMOS transistors 102 and 104 are both connected to a supply voltage Vcc, while the sources of the NMOS transistors 106 and 108 are both connected to a complementary supply voltage, such as ground or Vss. The gates of the PMOS transistor 102 and NMOS transistor 106 are coupled at a node 118, while their drains are also tied together at a node 120. The PMOS transistor 104 and the NMOS transistor 108 also having gates coupled together at the node 120, and drains at the node 118. The node 118 is coupled to a complementary read/write port bit line BLB via the NMOS transistor 112, which is controlled by a read/write word line WL. The node 120 is coupled to a read/write port bit line BL via the NMOS transistor 110, which is also controlled by the same read/write word line WL. In some special cases, this read/write port may serve only as a write port without the read function.

The read port portion of the conventional two-port SRAM cell 100 includes the NMOS transistor 114, which acts as a pull-down device and the NMOS transistor 116, which acts as a pass-gate device. A gate of the NMOS transistor 114 is connected to the node 120 (or 118), while its source is tied to the complementary supply voltage, such as ground or Vss. A high signal at the node 120 (or 118) can turn the NMOS transistor 114 on and ground the read port bit line BL when the NMOS transistor 116 is turned on by a high signal on the read word line WL.

Figure 1B:
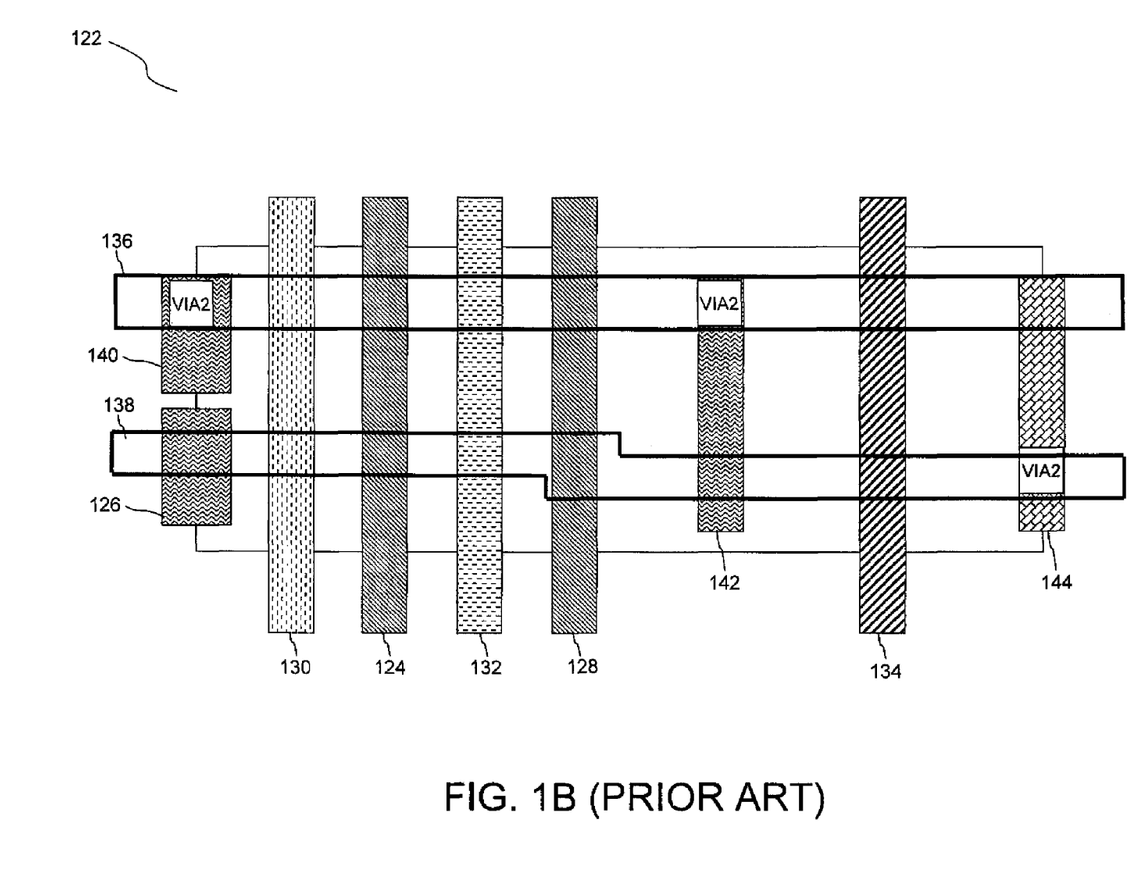
FIG. 1B illustrates a layout diagram of the metal routing for the conventional two-port SRAM cell shown in FIG. 1A.

FIG. 1B illustrates a layout diagram 122 of the metal routing for the conventional two-port SRAM cell 100 shown in FIG. 1A. The layout diagram 122 shows the metal routing for most of the interconnections used within the conventional two-port SRAM cell 100 of FIG. 1A. These interconnections include several power lines such as a supply voltage Vcc line 124, a complementary supply voltage Vss line 128, a landing pad 126 for another complementary supply voltage Vss line (not shown in this figure), and several bit lines and word lines. The bit lines shown are a read/write port bit line BL 130, a complementary read/write port bit line BLB 132, and a read port bit line BL 134. A read/write word line WL 136 is shown lined up in parallel with a read word line WL 138 on a metallization layer higher than that on which the Vcc line 124, the Vss line 128, the landing pad 126, the read/write port bit line BL 130, the complementary read/write port bit line BLB 132, and read port bit line BL 134 are constructed. Three landing pads 140, 142, and 144 are also implemented in parallel with the bit lines on the same metallization layer. The landing pads 140 and 142 are used for making connections with the read/write word line WL 136, while the landing pad 144 is used for making connections with the read word line WL 138.

One drawback of the conventional two-port SRAM cell 110 is that its layout structure is asymmetric. The read/write port bit line 130 is interposed between the landing pad 140 and the Vcc line 124. However, the complementary read/write port bit line BLB 132 is interposed between the Vss line 128 and the Vcc line 124. This asymmetric layout causes an imbalance of coupling capacitance between the read/write port bit line BL 130 and the complementary read/write port bit line BLB 132. As a result, the SRAM cell 100 suffers from a mismatch between read and write operations, induced by unwanted coupling capacitance and noise.

Figure 2A:
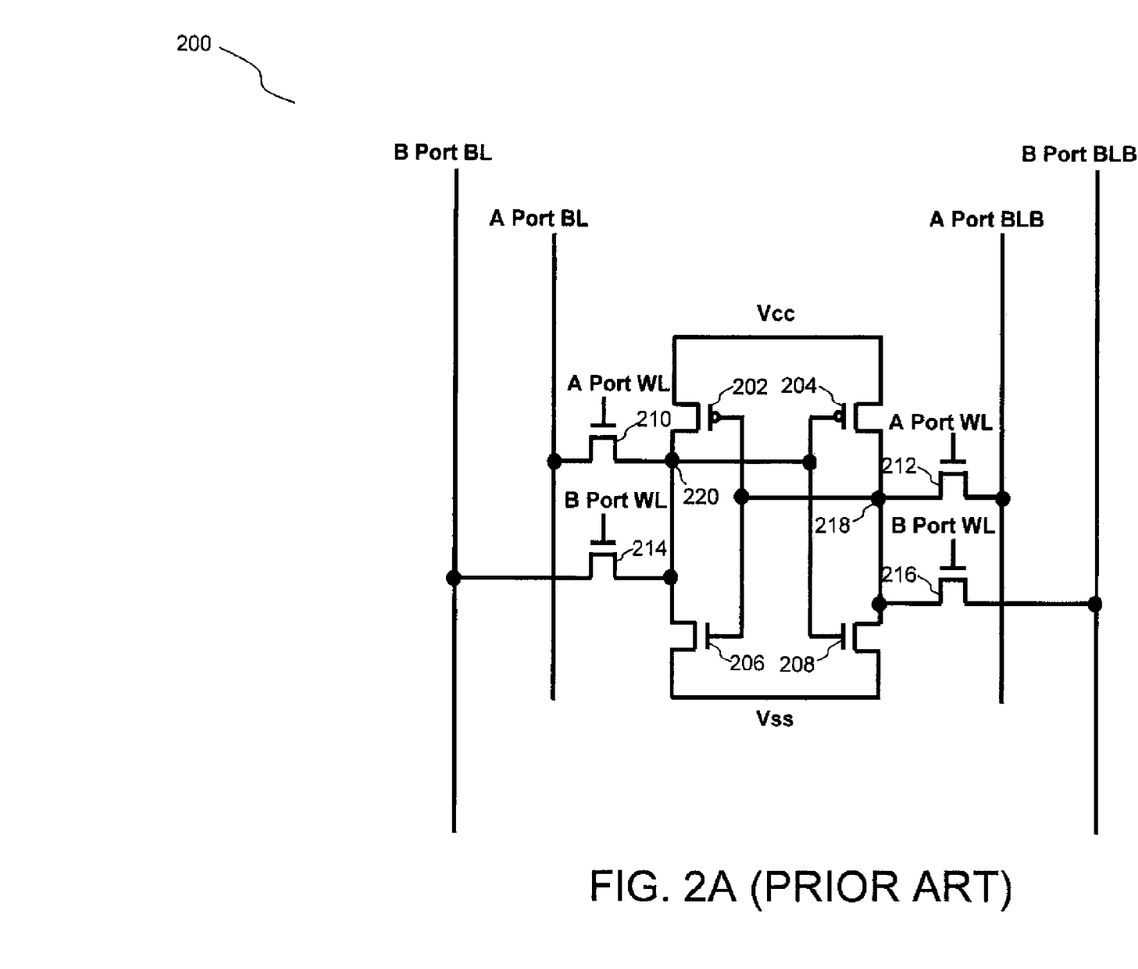
FIG. 2A schematically illustrates a conventional dual-port SRAM cell implemented with eight transistors.

FIG. 2A schematically illustrates a conventional dual-port SRAM cell 200 that is implemented with eight transistors. The conventional dual-port SRAM cell 200 includes two PMOS transistors 202 and 204 and six NMOS transistors 206, 208, 210, 212, 214, and 216. The dual-port SRAM cell 200 utilizes two sets of bit lines and complementary bit lines for A port (first read/write port) and B port (second read/write port), respectively. The sources of the PMOS transistors 202 and 204 are both connected to a supply voltage Vcc, while the sources of the NMOS transistors 206 and 208 are both connected to a complementary supply voltage, such as ground or Vss. The gates of the PMOS transistor 202 and NMOS transistor 206 are coupled at a node 218, while their drains are also tied together at a node 220. The gates of the PMOS transistor 204 and the NMOS transistor 208 are also coupled together at the node 220, and their drains coupled at the node 218. The node 218 is coupled to an A port (first read/write port) complementary bit line BLB via the NMOS transistor 212 as well as to a B port (second read/write port) complementary bit line BLB via the NMOS transistor 216. The NMOS transistor 212 is controlled by an A port word line, while the NMOS transistor 216 is controlled by a B port word line. The node 220 is coupled to an A port bit line BL via the NMOS transistor 210 as well as to a B port bit line BL via the NMOS transistor 214. The NMOS transistor 210 is controlled by the A port word line while the NMOS transistor 214 is controlled by the B port word line.

Figure 2B:
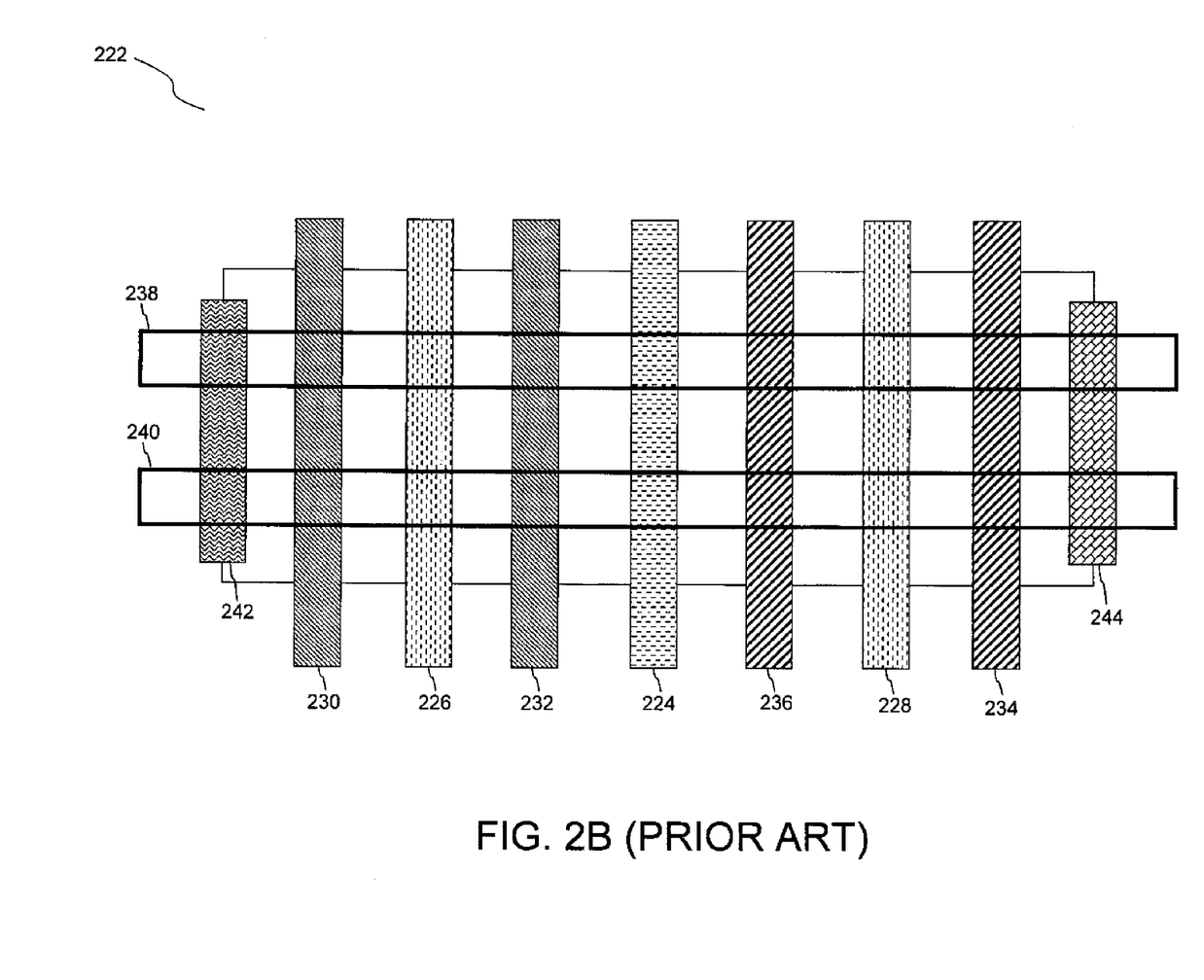
FIG. 2B illustrates a layout diagram of the metal routing for the conventional dual-port SRAM cell shown in FIG. 2A.

FIG. 2B illustrates a layout diagram 222 of the metal routing for the conventional dual-port SRAM cell 200 shown in FIG. 2A. The layout diagram 222 shows interconnections including several supply lines such as a supply voltage Vcc line 224 and two complementary supply voltage Vss lines 226 and 228 as well as several bit lines and word lines. The bit lines shown are an A port bit line BL 230, a complementary A port bit line BLB 232, a B port bit line BL 234, and a complementary B port bit line BLB 236. An A port word line WL 238 is shown lined up in parallel with a B port word line WL 240. Two landing pads 242 and 244 are also implemented in parallel with the bit lines and supply voltage lines. The landing pad 242 is used for making connections with the A port word line WL 238, while the landing pad 244 is used for making connections with the B port word line WL 240.

Although the conventional dual-port SRAM cell 200 provides a symmetrical layout structure, there is still a balancing issue induced by the coupling capacitance on the bit lines. For example, the placements of the A port bit line BL 230 between the complementary supply voltage Vss line 226 and the landing pad 242, and the placement of the complementary write port bit line BLB 232 between the complementary supply voltage Vss line 226 and the supply voltage Vcc line 224 can create an imbalance of coupling capacitance. The same coupling capacitance imbalance issue may occur for the B port bit line BL 234 and the complementary B port bit line BLB 236, since the B port bit line BL 234 is placed between the complementary supply voltage Vss line 228 and the landing pad 244 and the complementary B port bit line BLB 236 is placed between the complementary supply voltage Vss line 228 and the supply voltage Vcc line 224. An imbalance between the coupling capacitance of the interconnection wires may result in an undesired level of noise margin, thereby hindering the operation speed of the cell.

As such, desirable in the art of integrated circuit designs are new SRAM cell structures with balanced read and write operation speeds and an improved noise margin.

SUMMARY

The present invention discloses a multiple-port SRAM cell structure. In one embodiment of the invention, the cell structure includes a first and a second bit-line placed in parallel forming a complimentary bit-line pair for the dedicated read port, a first and second metal line adjacently flanking in both side of and in parallel to the first bit-line, the first and second metal line being formed in the same metal layer as the first bit-line and having a first and second predetermined distance to the first bit-line, respectively, and a third and fourth metal line adjacently flanking in both side of and in parallel to the second bit-line, the third and fourth metal line being formed in the same metal layer as the second bit-line and having a third and fourth predetermined distance to the second bit-line, respectively, wherein the first predetermined distance is equal to the third distance and the second predetermined distance is equal to the fourth distance for keeping the first and second bit-lines having balanced capacitance loading.

The construction and method of operation of the invention, however, together with additional objects and advantages thereof will be best understood from the following description of specific embodiments when read in connection with the accompanying drawings.

DESCRIPTION

This invention is related to a multiple-port SRAM cell with a symmetric layout structure in order to achieve balanced read and write operation speeds and an improved noise margin. The following merely illustrates various embodiments of the present invention for purposes of explaining the principles thereof. It is understood that those skilled in the art will be able to devise various equivalents that, although not explicitly described herein, embody the principles of this invention.

Figure 3A:
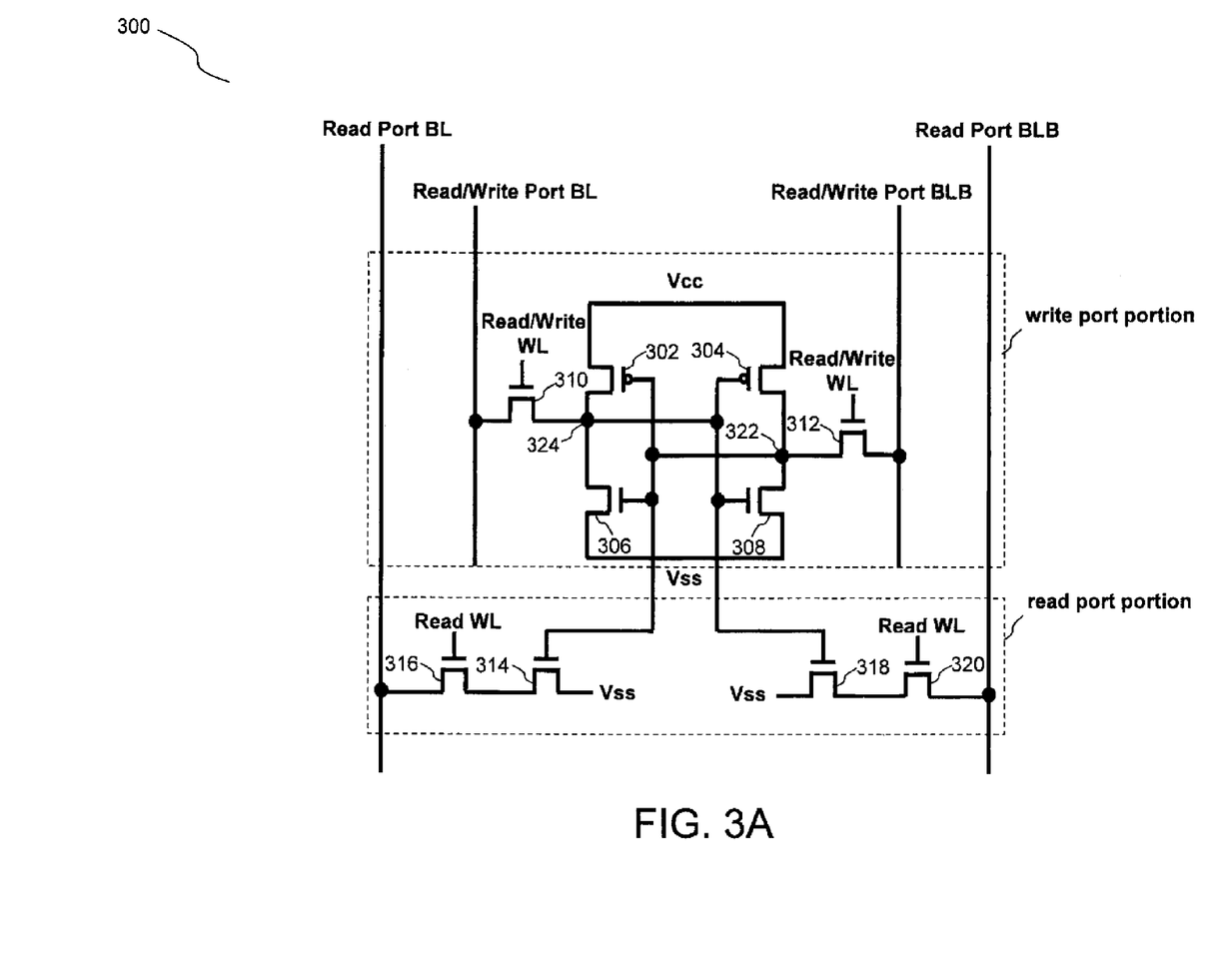
FIG. 3A schematically illustrates a two-port SRAM cell implemented with ten transistors in accordance with one embodiment of the present invention.

FIG. 3A illustrates a circuit diagram of a two-port SRAM cell 300 that is implemented with ten transistors in accordance with one embodiment of the present invention. The two-port SRAM device 300 includes two PMOS transistors 302 and 304 and eight NMOS transistors 306, 308, 310, 312, 314, 316, 318, and 320. In the read/write port portion of this two-port SRAM cell 300, the PMOS transistors 302 and 304 are used as pull-up devices, the NMOS transistors 306 and 308 are used as pull-down devices, and the NMOS transistors 310 and 312 are used as pass-gate devices. The sources of the PMOS transistors 302 and 304 are both connected to a supply voltage Vcc, while the sources of the NMOS transistors 306 and 308 are both connected to a complementary supply voltage, such as ground or Vss. The gates of the PMOS transistor 302 and NMOS transistor 306 are coupled at a node 322, while their drains are also tied together at a node 324. The PMOS transistor 304 and the NMOS transistor 308 are also coupled together at the gates at the node 324 and at the drains at the node 322. The node 322 is coupled to the read/write port complementary bit line BLB via the NMOS transistor 312, which is controlled by a read/write word line WL connected to its gate. The node 324 is coupled to the read/write port bit line BL via the NMOS transistor 310, which is also controlled by the same read/write word line WL via its gate. The combination of the transistors 302, 304, 306, 308, 310 and 312 can be alternatively seen as a latch into which a value and its complement can be written.

The read port portion of this two-port SRAM device 300 includes the NMOS transistors 314, 316, 318, and 320. The NMOS transistors 314 and 318 are utilized as pull-down devices, and the NMOS transistors 316 and 320 are used as pass-gate devices. The transistors 314 and 316 can be seen as one read pair to be coupled with the read port bit line BL, while the transistors 318 and 320 can be seen as another read pair to be coupled with the read port complementary bit line BLB. A gate of the NMOS transistor 314 is connected to the node 322, while its source is tied to the complementary supply voltage Vss. A high signal at the node 322 can turn on the NMOS transistor 314, and ground the read port bit line BL when the NMOS transistor 316 is turned on by a high signal on the read word line WL. A gate of the NMOS transistor 318 is connected to the node 324, while its source is tied to the complementary supply voltage Vss. A high signal at the node 324 can turn the NMOS transistor 318 on and ground the read port complementary bit line BLB when the NMOS transistor 320 is turned on by a high signal on the read word line WL.

Before write operation of read/write port, the read/write port bit lines BL is pre-charged (to high state) and the complementary read/write port bit line BLB is dis-changed (to low state). The logic states on the bit line BL and the complementary bit line BLB can be inversed depending on the value to be written into the cell. The read/write word line WL is then pulled high to turn on the NMOS transistors 310 and 312 to allow the data to be stored in the cell.

This read/write port also can serve for data read purposes. In read operation, both read/write port bit lines BL and BLB are pre-charged. The read/write word line WL is then pulled high to turn on the NMOS transistors 310 and 312 to allow the data to be read by sensing circuits. The bit cells data can also be read by the read port. During read port sensing operation, the read word line WL is pulled high to turn on the NMOS transistors 316 and 320. If a high signal is at the node 322 and a low signal is at the node 324, the NMOS transistor 318 will be turned on pulling the read port complementary bit line BLB low to ground, while the NMOS transistor 314 remains at an off-state keeping the read port bit line BL high.

Figure 3B:
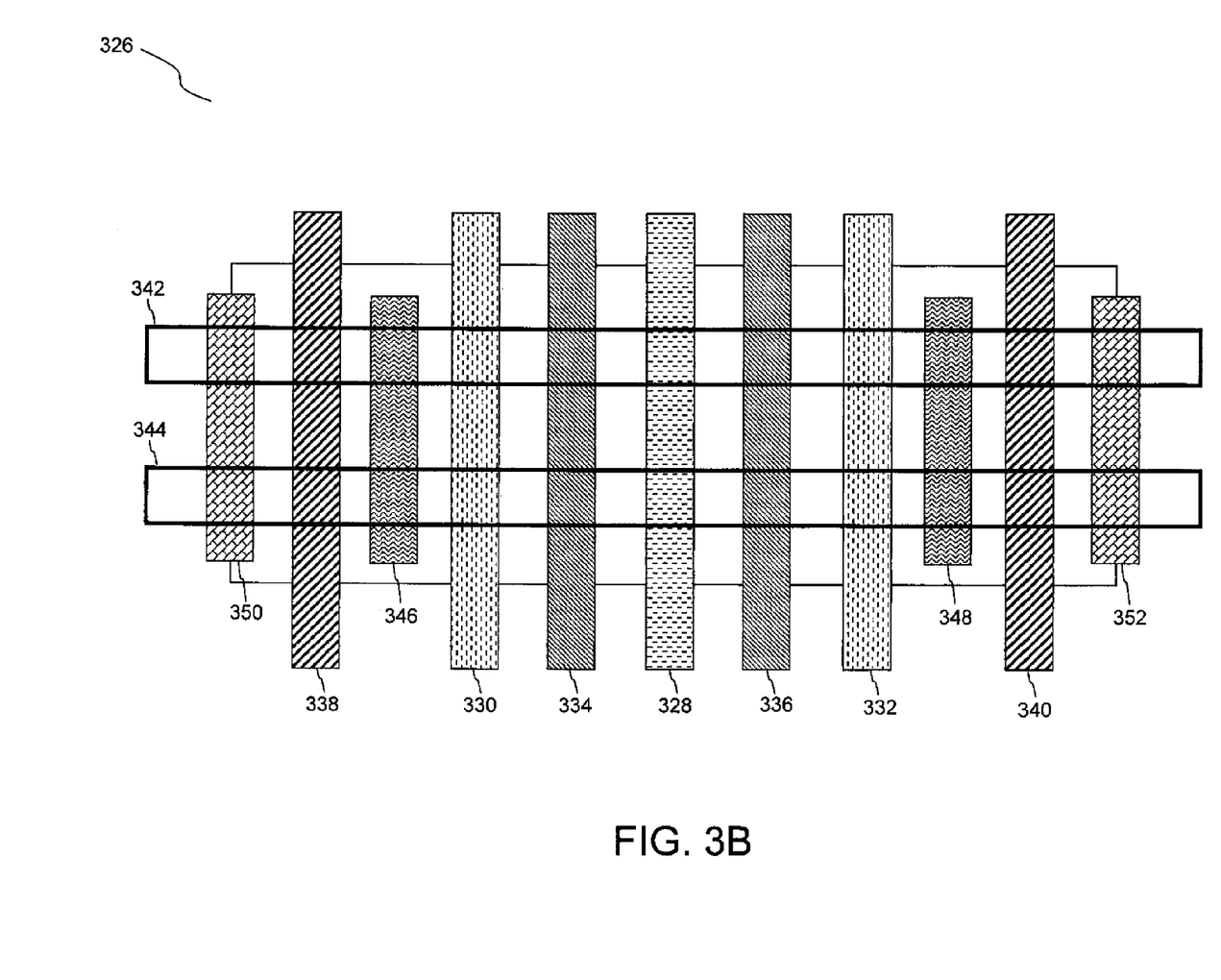
FIGS. 3B and 3C illustrate two layout diagrams of the metal routing for the two-port SRAM cell shown in FIG. 3A in accordance with various embodiments of the present invention.

FIG. 3B illustrates a layout diagram 326 of the metal routing for the two-port SRAM device 300 shown in FIG. 3A in accordance with one embodiment of the present invention. The layout diagram 326 shows the metal routing for most of the interconnections used within the two-port SRAM device 300 of FIG. 3A. These interconnections include several supply lines such as a supply voltage Vcc line 328, two complementary supply voltage Vss lines 330 and 332, word line landing pads 350, 346, 348 and 352, as well as several bit lines and word lines. The bit lines shown include a read/write port bit line BL 334, a read/write port complementary bit line BLB 336, a read port bit line BL 338, and a read port complementary bit line BLB 340. A read word line WL 342 is shown lined up in parallel with a read/write word line WL 344. Four landing pads 346, 348, 350, and 352 are also implemented in parallel with the bit lines and supply lines. The landing pads 346 and 348 are used for making connections with the read/write word line WL 344, while the landing pads 350 and 352 are used for making connections with the read word line WL 342. With this structure, the length ratio between the bit lines and the word lines can be made less than about ¼ for high speed SRAM devices.

In order to prevent coupling capacitance imbalance from occurring, each bit line is designed to be separated by a landing pad or a supply line such as the supply voltage Vcc line 328 or the complementary supply voltage Vss line 330 or 332. The placement of the metals within this layout structure is also fully symmetrical, thus allowing a balance performance for the cell current and RC delay between the bit lines and the complementary bit lines. In other words, a set of conductor lines including the read port bit line BL 338, the read port complementary bit line BLB 340, the read/write port bit line BL 334, and the read/write port complementary bit line BLB 336 are separated from one another by a set of separators including the complementary supply voltage Vss lines 330 and 332, the supply voltage Vcc line 328, and the landing pads 346, 348, 350 and 352.

Note that the layout direction of the N-well and the P-well, which are not shown in this figure, are in parallel with the bit lines along the shorter side of the SRAM cell, and each SRAM cell has one N-well located between two P-wells. The word lines, such as the read word line WL 342 and the read/write word line WL 344, are placed in a perpendicular direction to the bit lines.

Figure 3C:
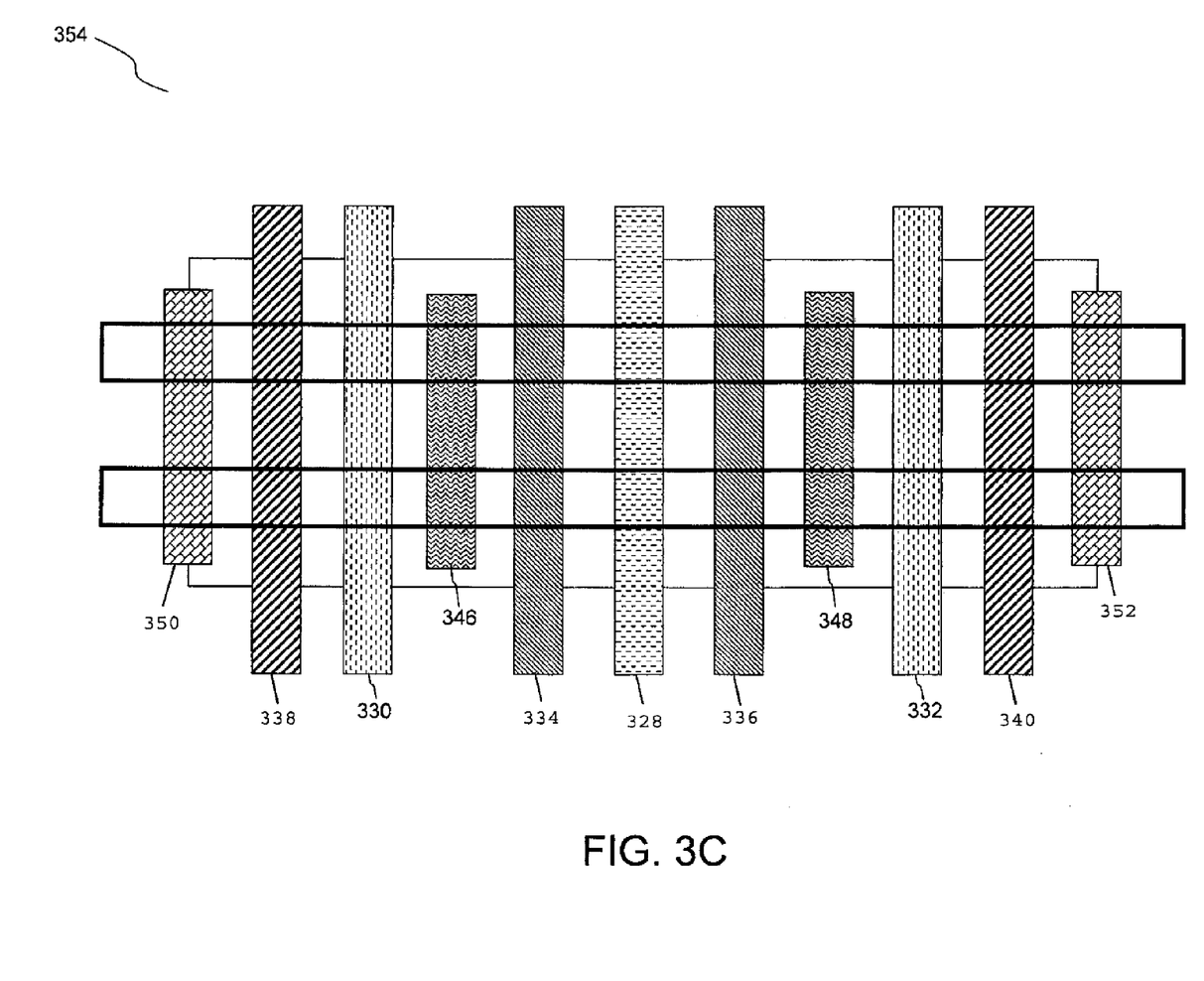

FIG. 3C illustrates an alternative layout diagram 354 of the metal routing for the two-port SRAM cell 300 shown in FIG. 3A in accordance with another embodiment of the present invention. This alternative layout diagram 354 is similar to the layout diagram 326 shown in FIG. 3B where the exact same interconnections used within the layout in diagram 326 are also used within this alternative layout diagram 354. One difference between the layout diagrams 326 and 354 is the placements of four metal routings. The placement of the complementary supply voltage Vss line 330 is switched with the placement of the landing pad 346, and the placement of the complementary supply voltage Vss line 332 is switched with the placement of the landing pad 348.

Similar to the layout diagram 326 shown in FIG. 3B, each bit line in this structure is designed to be separated by a landing pad or a supply line, and the placement of the metals within this layout structure is also fully symmetrical, thus allowing a balance performance for the cell current and RC delay between the bit lines and the complementary bit lines.

Figure 4A:
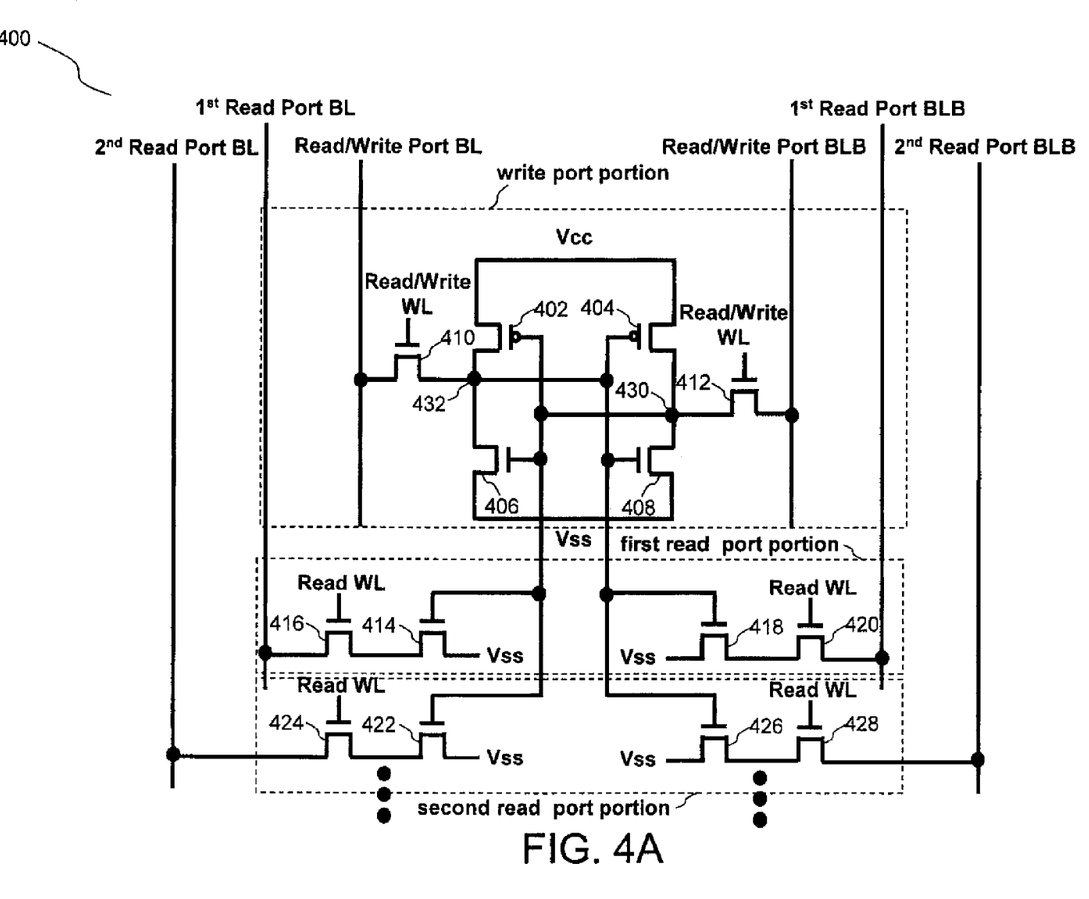
FIG. 4A schematically illustrates a multiple-port SRAM cell implemented with fourteen transistors in accordance with another embodiment of the present invention.

FIG. 4A illustrates a circuit diagram of a multiple-port SRAM cell 400 that is implemented with fourteen transistors in accordance with another embodiment of the present invention. By implementing multiple ports for a SRAM cell, more read ports can be created to increase the read/write operation speed. The multiple-port SRAM cell 400 includes two PMOS transistors 402, 404 and twelve NMOS transistors 406, 408, 410, 412, 414, 416, 418, 420, 422, 424, 426, and 428. In the read/write port portion of this multiple-port SRAM device 400, the PMOS transistors 402 and 404 are used as pull-up devices while the NMOS transistors 406 and 408 are used as pull-down devices, and the NMOS transistors 410 and 412 are used as pass-gate devices. The sources of the PMOS transistors 402 and 404 are both connected to a supply voltage Vcc while the sources of the NMOS transistors 406 and 408 are both connected to a complementary supply voltage Vss. The gates of the PMOS transistor 402 and NMOS transistor 406 are coupled at a node 430, while their drains are also tied together at a node 432. The PMOS transistor 404 and the NMOS transistor 408 are also coupled together at the gates at the node 432 and at the drains at the node 430. The node 430 is coupled to the read/write port complementary bit line BLB via the NMOS transistor 412, which is controlled by a read/write word line WL connected to its gate. The node 432 is coupled to the read/write port bit line BL via the NMOS transistor 410, which is also controlled by the same read/write word line WL via its gate. The combination of the transistors 402, 404, 406, 408, 410 and 412 can be alternatively seen as a latch to which a value and its complement can be written.

Since there are multiple read ports for this multiple-port SRAM cell 400, the number of transistors implemented within the read port portion will also be higher. The first read port portion of this multiple-port SRAM cell 400 includes four NMOS transistors 414, 416, 418, and 420, while the second read port portion of this multiple-port SRAM cell 400 includes four NMOS transistors 422, 424, 426, and 428. The NMOS transistors 414 and 418 are utilized as pull-down devices for the first read port, and the NMOS transistors 416 and 420 are used as pass-gate devices for the first read port. The NMOS transistors 422 and 426 are utilized as pull-down devices for the second read port, and the NMOS transistors 424 and 428 are used as pass-gate devices for the second read port. The gates of the NMOS transistors 414 and 422 are both connected to the node 430, while both sources of the NMOS transistors 414 and 422 are tied to the complementary supply voltage Vss. A high signal at the node 430 will turn both NMOS transistors 414 and 422 on allowing both first read port bit line BL and second read port bit line BL to be pulled low to the ground when the NMOS transistors 416 and 424 are turned on by a high signal on the read word line WL. The gates of the NMOS transistors 418 and 426 are both connected to the node 432 while both sources of the NMOS transistors 418 and 426 are tied to the supply ground Vss. A high signal at the node 432 will turn both NMOS transistors 418 and 426 on allowing both first read port complementary bit line BLB and second read port complementary bit line BLB to be pulled low to the ground when the NMOS transistors 420 and 428 are turned on by a high signal on the read word line WL.

Before a write operation, the read/write port bit lines BL is pre-charged (to high state) and the complementary read/write port bit line BLB is dis-changed (to low state). The logic states on the bit line BL and the complementary bit line BLB can be inversed depending on a value to be written into the cell. The read/write word line WL is then pulled high to turn on the NMOS transistors 410 and 410 to allow the data to be stored in the cell.

During sensing operation, the read word line WL for both the first and the second read ports are pulled high to turn on the NMOS transistors 416, 420, 424, and 428. If a high signal is at the node 432 and a low signal is at the node 430, the NMOS transistors 418 and 426 will be turned on, thus pulling the first read complementary port bit line BLB and the second read complementary port bit line BLB low to the ground, while the NMOS transistors 414 and 422 remain at off-states, thus keeping both the first read port bit line BL and the second read port bit line BL high.

It is understood by those skilled in the art that the number of read ports needs not be limited to the two illustrated in FIG. 4A, and may be increased without deviating from the spirit of this invention.

Figure 4B:
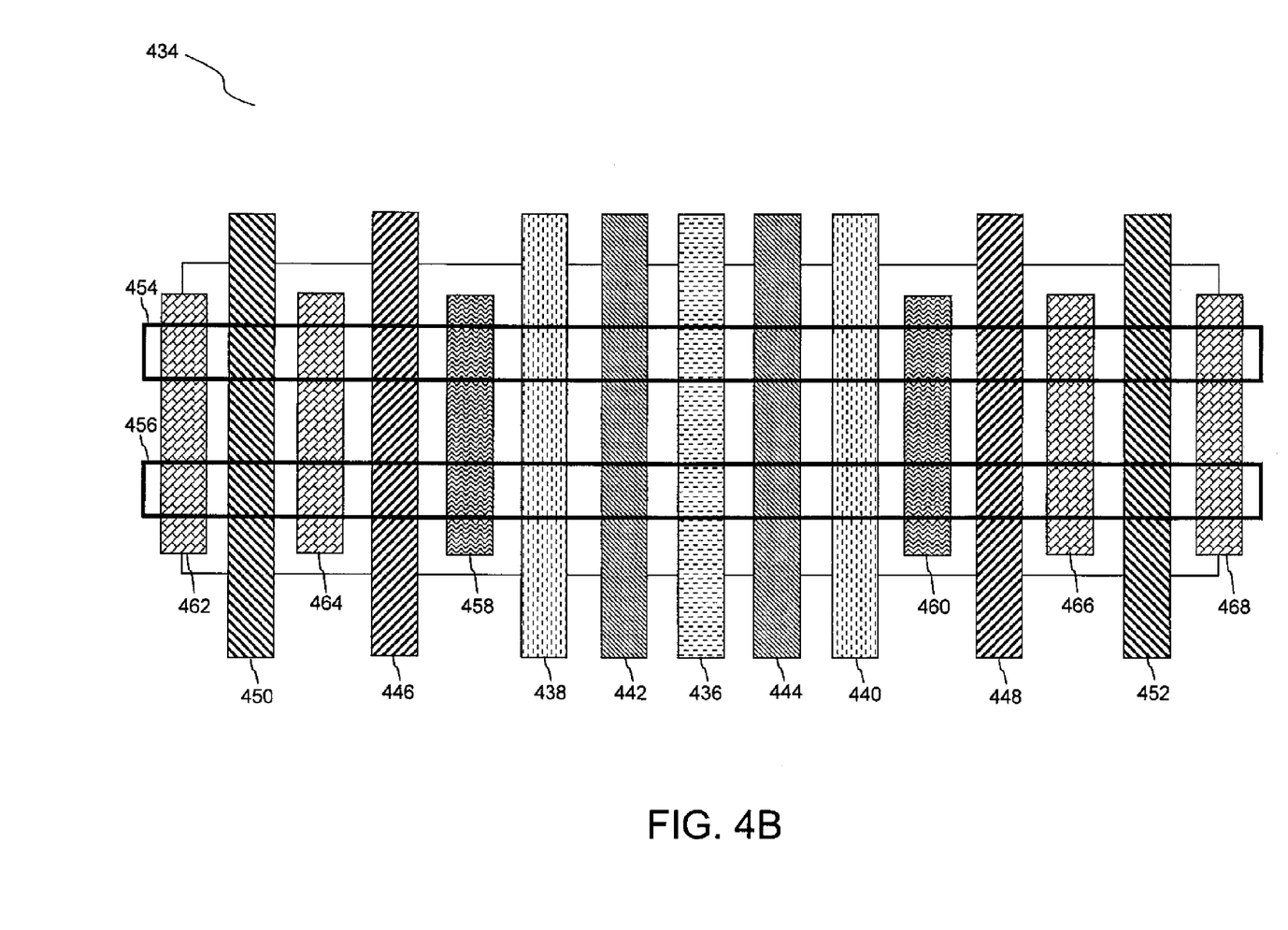
FIG. 4B illustrates a layout diagram of the metal routing for the multiple-port SRAM cell shown in FIG. 4A in accordance with yet another embodiment of the present invention.

FIG. 4B illustrates a layout diagram 434 of the metal routing for the multiple-port SRAM cell 400 shown in FIG. 4A in accordance with another embodiment of the present invention.

The layout diagram 434 shows the metal routing for most of the interconnections used within the multiple-port SRAM cell 400 of FIG. 4A. These interconnections include several supply lines such as a supply voltage Vcc line 436 and two complementary supply voltage Vss lines 438 and 440 as well as several bit lines and word lines. The bit lines shown include a read/write port bit line BL 442, a read/write port complementary bit line BLB 444, a first read port bit line BL 446, a first read port complementary bit line BLB 448, a second read port bit line BL 450, and a second read port complementary bit line BLB 452. A read word line WL 454 is shown lined up in parallel with a read/write word line WL 456. Six landing pads 458, 460, 462, 464, 466, and 468 are also implemented in parallel with the bit lines and supply lines. The landing pads 458 and 460 are used for making connections with the read/write word line WL 456 while the landing pads 462, 464, 466, and 468 are used for making connections with the read word line WL 454.

Similar to the examples shown in FIGS. 3B and 3C, the placement of the metals within this layout diagram 434 is also fully symmetrical, thus allowing a balance performance for read and write operations. With this structure, the length ratio between the bit lines and the word lines for this layout structure can be made less than about ⅕ for high speed SRAM devices.

Note that the layout direction of the N-well and the P-well, which are not shown in this figure, are in parallel with the bit lines along the shorter side of the SRAM cell, and each SRAM cell has one N-well located between two P-wells. The word lines, such as the read word line WL 454 and the write word line WL 456, are placed in perpendicular direction to the bit lines.

By implementing a symmetrical layout structure for a SRAM cell, a stable and high speed two-port or multiple-port SRAM device can be created. The symmetrical nature of this invention provides a high speed and fully speed-balanced SRAM cell structure between both read cycles and write cycles. Proposed metal routings also provide fully noise shielding to prevent coupling capacitance imbalance between interconnections, thereby improving noise margins.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) cell having a dedicated read port separated from a write port, the SRAM cell comprising:
   a first bit-line and a second bit-line placed in parallel forming a complementary bit-line pair for the dedicated read port;
   a third bit-line and a fourth bit-line placed in parallel forming a complementary bit-line pair for the write port;
   a positive voltage supply line disposed between a first ground line and a second ground line placed in parallel, wherein each bit-line is separated by either the positive voltage supply line or one of the ground lines;
   a first metal line and a second metal line adjacently flanking and in parallel to the first bit-line, the first metal line and the second metal line being formed in the same metal layer as the first bit-line; and
   a third metal line and a fourth metal line adjacently flanking and in parallel to the second bit-line, the third metal line and the fourth metal line being formed in the same metal layer as the second bit-line,
   wherein the first metal line and the first ground line disposed next to the first metal line are placed between the first bit-line and the third bit-line, and the third metal line and the second ground line disposed next to the third metal line are placed between the second bit-line and the fourth bit-line.

2. The SRAM cell of claim 1, wherein the first and second bit-lines are formed in the same metal layer and have substantially the same width for having balanced resistance and capacitance loading.

3. The SRAM cell of claim 1, wherein both the first and the third metal lines are for write word line landing pad while both the second and the fourth metal lines are for read word line landing pad.

4. The SRAM cell of claim 1, wherein each of the first, second, third, and fourth metal lines is a landing pad for a word line.

5. The SRAM cell of claim 1 further comprising:
   a latch having a first storage node and a second storage node, the first and the second storage node always storing complementary values;

a first NMOS transistor having a source, a drain and a gate coupled to the complementary low voltage supply, the first bit-line and the second node, respectively; and a second NMOS transistor having a source, a drain and a gate coupled to the complementary low voltage supply, the second bit-line and the first node, respectively.

6. The SRAM cell of claim 5 further comprising:

a third NMOS transistor having a source and a drain coupled between the drain of the first NMOS transistor and the first bit-line, the third NMOS transistor having a gate coupled to a read word-line; and a fourth NMOS transistor having a source and a drain coupled between the drain of the second NMOS transistor and the second bit-line, the fourth NMOS transistor having a gate also coupled to the read word-line.

7. The SRAM cell of claim 1 further comprising:

a fifth NMOS transistor having a source and a drain coupled between the third bit-line and a first storage node, the fifth NMOS transistor having a gate coupled to a write word-line; and a sixth NMOS transistor having a source and a drain coupled between the fourth bit-line and a second storage node, the sixth NMOS transistor having a gate coupled to the write word-line.

8. The SRAM cell of claim 7, wherein a fifth metal line and a sixth metal line adjacently flanking and in parallel to the third bit-line, the fifth and sixth metal line being formed in the same metal layer as the third bit-line; and the fifth metal line and a seventh metal line adjacently flanking and in parallel to the fourth bit-line, the fifth metal line and the seventh metal line being formed in the same metal layer as the fourth bit-line.

9. The SRAM cell of claim 8, wherein the fifth metal line is a high voltage power supply line while both the sixth and the seventh metal lines are complementary low voltage power supply lines.

* * * * *